(12) United States Patent
Bao et al.

(10) Patent No.: US 10,155,876 B2
(45) Date of Patent: Dec. 18, 2018

(54) METHODS AND APPARATUS CONCERNING SOLUTION SHEARING A TRANSPARENT AND CONDUCTIVE POLYMER FILM

(71) Applicant: The Board of Trustees of the Leland Stanford Junior University, Stanford, CA (US)

(72) Inventors: Zhenan Bao, Stanford, CA (US); Sean C. Andrews, Stanford, CA (US); Brian J. Worfolk, Stanford, CA (US); Stefan C. B. Mannsfeld, Morgan Hill, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 0 days.

(21) Appl. No.: 15/336,357

(22) Filed: Oct. 27, 2016

(65) Prior Publication Data
US 2017/0114240 A1     Apr. 27, 2017

Related U.S. Application Data

(60) Provisional application No. 62/247,006, filed on Oct. 27, 2015.

(51) Int. Cl.
*B23B 3/02* (2006.01)
*C09D 125/18* (2006.01)
(Continued)

(52) U.S. Cl.
CPC ............ *C09D 125/18* (2013.01); *B05D 1/40* (2013.01); *C09D 5/24* (2013.01); *C09D 165/00* (2013.01); *H01B 1/127* (2013.01); *H01L 51/442* (2013.01); *C08G 2261/1424* (2013.01); *C08G 2261/3223* (2013.01); *C08G 2261/512* (2013.01); *C08G 2261/794* (2013.01); *C08G 2261/91* (2013.01); *C08G 2261/92* (2013.01); *Y02E 10/549* (2013.01)

(58) Field of Classification Search
CPC ...... C09D 125/18; C09D 165/00; C09D 5/24; H01L 51/442; B05D 1/40; H01B 1/127
See application file for complete search history.

(56) References Cited

U.S. PATENT DOCUMENTS 5,639,398 A * 6/1997 Rhee ...................... C09K 19/52
                                                            252/299.01
7,855,121 B2    12/2010 Kim et al.
(Continued)

OTHER PUBLICATIONS

Mineral Commodity Profile : Indium by John D. Jorgenson and Michael W. George (2013, Paperback).
(Continued)

*Primary Examiner* — Elizabeth E Mulvaney
(74) *Attorney, Agent, or Firm* — Crawford Maunu PLLC

(57) ABSTRACT

Various embodiments include apparatus and methods of forming an apparatus using a solution shearing process. An example method includes providing a shearing blade on a portion of a substrate coated with a polymeric conductor material and controlling generation of a transparent and conductive polymer film on the substrate by moving the shearing blade in a direction, to generate shear stress to the polymeric conductor material, and according to shearing deposition parameters.

24 Claims, 13 Drawing Sheets

(51) Int. Cl.
  B05D 1/40    (2006.01)
  C09D 5/24    (2006.01)
  C09D 165/00  (2006.01)
  H01L 51/44   (2006.01)
  H01B 1/12    (2006.01)

(56) References Cited

U.S. PATENT DOCUMENTS

2014/0318440 A1    10/2014  Boo et al.
2015/0060119 A1*   3/2015   Lin .................... H05K 1/097
                                                        174/257

OTHER PUBLICATIONS

Tait, Jeffrey G., et al. "Spray coated high-conductivity PEDOT: PSS transparent electrodes for stretchable and mechanically-robust organic solar cells." Solar Energy Materials and Solar Cells 110 (2013): 98-106.Abstract only.
Vosgueritchian, Michael, Darren J. Lipomi, and Zhenan Bao. "Highly conductive and transparent PEDOT: PSS films with a fluorosurfactant for stretchable and flexible transparent electrodes." Advanced functional materials 22.2 (2012): 421-428. Abstract only.
Hecht, David S., and Richard B. Kaner. "Solution-processed transparent electrodes." MRS bulletin 36.10 (2011): 749-755.
Hecht, David S., Liangbing Hu, and Glen Irvin. "Emerging Transparent Electrodes Based on Thin Films of Carbon Nanotubes, Graphene, and Metallic Nanostructures." Adv. Mater 23 (2011): 1482-1513.
Hauger, T. C., et al. "Real-time resistance, transmission and figure-of-merit analysis for transparent conductors under stretching-mode strain." Solar Energy Materials and Solar Cells 124 (2014): 247-255. Abstract only.
Kim, Yong Hyun, et al. "Highly conductive PEDOT: PSS electrode with optimized solvent and thermal post-treatment for ITO-free organic solar cells." Advanced Functional Materials 21.6 (2011): 1076-1081 Abstract only.
Minami, Tadatsugu. "Transparent conducting oxide semiconductors for transparent electrodes." Semiconductor Science and Technology 20.4 (2005): S35. Abstract only.
Emmott, Christopher JM, Antonio Urbina, and Jenny Nelson. "Environmental and economic assessment of ITO-free electrodes for organic solar cells." Solar Energy Materials and Solar Cells 97 (2012): 14-21.
Lipomi, Darren J., et al. "Electronic properties of transparent conductive films of PEDOT: PSS on stretchable substrates." Chemistry of Materials 24.2 (2012): 373-382. Abstract only.
Song, Myungkwan, et al. "Highly efficient and bendable organic solar cells with solution-processed silver nanowire electrodes." Advanced Functional Materials 23.34 (2013): 4177-4184.
Margulis, George Y., et al. "Spray Deposition of Silver Nanowire Electrodes for Semitransparent Solid-State Dye-Sensitized Solar Cells." Advanced Energy Materials 3.12 (2013): 1657-1663.
Song, Myungkwan, et al. "Highly efficient and bendable organic solar cells with solution-processed silver nanowire alectrodes." Advanced Functional Materials 23.34 (2013): 4177-4184.
Rathmell, Aaron R., and Benjamin J. Wiley. "The synthesis and coating of long, thin copper nanowires to make flexible, transparent conducting films on plastic substrates." Advanced Materials 23.41 (2011): 4798-4803.
Wu, Junbo, et al. "Organic light-emitting diodes on solution-processed graphene transparent electrodes." ACS nano 4.1 (2009): 43-48.
Becerril, Héctor A., et al. "Evaluation of solution-processed reduced graphene oxide films as transparent conductors." ACS nano 2.3 (2008): 463-470.
Zhu, Yu, et al. "Rational design of hybrid graphene films for high-performance transparent electrodes." ACS nano 5.8 (2011): 6472-6479. Abstract only.
Wu, Zhuangchun, et al. "Transparent, conductive carbon nanotube films." Science 305.5688 (2004): 1273-1276.
Gaynor, Whitney, et al. "Smooth nanowire/polymer composite transparent electrodes." Advanced Materials 23.26 (2011): 2905-2910.
Wu, Hui, et al. "A transparent electrode based on a metal nanotrough network." Nature nanotechnology 8.6 (2013): 421-425.
Hsu, Po-Chun, et al. "Performance enhancement of metal nanowire transparent conducting electrodes by mesoscale metal wires." Nature 4.2522 (2013).
Ouyang, Jianyong. ""Secondary doping" methods to significantly enhance the conductivity of PEDOT: PSS for its application as transparent electrode of optoelectronic devices." Displays 34.5 (2013): 423-436. Abstract only.
Alemu, Desalegn, et al. "Highly conductive PEDOT: PSS electrode by simple film treatment with methanol for ITO-free polymer solar cells." Energy & Environmental Science 5.11 (2012): 9662-9671. Abstract only.
Xia, Yijie, Kuan Sun, and Jianyong Ouyang. "Solution-processed metallic conducting polymer films as transparent electrode of optoelectronic devices." Advanced Materials 24.18 (2012): 2436-2440.
Atanasov, Sarah E., et al. "Highly conductive and conformal poly (3, 4-ethylenedioxythiophene)(PEDOT) thin films via oxidative molecular layer deposition." Chemistry of Materials 26.11 (2014): 3471-3478. Abstract only.
Kim, Nara, et al. "Highly Conductive PEDOT: PSS Nanofibrils Induced by Solution-Processed Crystallization." Advanced materials 26.14 (2014): 2268-2272.
Kim, Nara, et al. "Highly Conductive All-Plastic Electrodes Fabricated Using a Novel Chemically Controlled Transfer-Printing Method." Advanced Materials 27.14 (2015): 2317-2323.
Diao, Ying, et al. "Morphology control strategies for solution-processed organic semiconductor thin films." Energy & Environmental Science 7.7 (2014): 2145-2159.
Giri, Gaurav, et al. "Tuning charge transport in solution-sheared organic semiconductors using lattice strain." Nature 480 (2011): 22.
Becerril, Héctor A., et al. "High-Performance Organic Thin-Film Transistors through Solution-Sheared Deposition of Small-Molecule Organic Semiconductors." Advanced Materials 20.13 (2008): 2588-2594.
Diao, Ying, et al. "Solution coating of large-area organic semiconductor thin films with aligned single-crystalline domains." Nature materials 12.7 (2013): 665-671.
Le Berre, Maël, Yong Chen, and Damien Baigl. "From convective assembly to Landau-Levich deposition of multilayered phospholipid films of controlled thickness." Langmuir 25.5 (2009): 2554-2557.
Worfolk, Brian J., et al. "Work Function Control of Interfacial Buffer Layers for Efficient and Air-Stable Inverted Low-Bandgap Organic Photovoltaics." Advanced Energy Materials 2.3 (2012): 361-368. Abstract only.
O'Connor, Brendan, et al. "Anisotropic Structure and Charge Transport in Highly Strain-Aligned Regioregular Poly (3-hexylthiophene)." Advanced Functional Materials 21.19 (2011): 3697-3705.
Pettersson, Leif AA, Soumyadeb Ghosh, and Olle Inganäs. "Optical anisotropy in thin films of poly (3, 4-ethylenedioxythiophene)-poly (4-styrenesulfonate)." Organic Electronics 3.3 (2002): 143-148. Abstract only.
Palumbiny, Claudia M., et al. "The crystallization of PEDOT: PSS polymeric electrodes probed in situ during printing." Advanced Materials 27.22 (2015): 3391-3397. Abstract only.
Ito, Yutaka, et al. "Crystalline ultrasmooth self-assembled monolayers of alkylsilanes for organic field-effect transistors." Journal of the American Chemical Society 131.26 (2009): 9396-9404.
Mannsfeld, Stefan CB, Ming Lee Tang, and Zhenan Bao. "Thin film structure of triisopropylsilylethynyl-functionalized pentacene and tetraceno [2, 3-b] thiophene from grazing incidence X-Ray diffraction." Advanced Materials 23.1 (2011): 127-131. Abstract only.
Giri, Gaurav, et al. "High-Mobility, Aligned Crystalline Domains of TIPS-Pentacene with Metastable Polymorphs Through Lateral Confinement of Crystal Growth." Advanced Materials 26.3 (2014): 487-493.

* cited by examiner

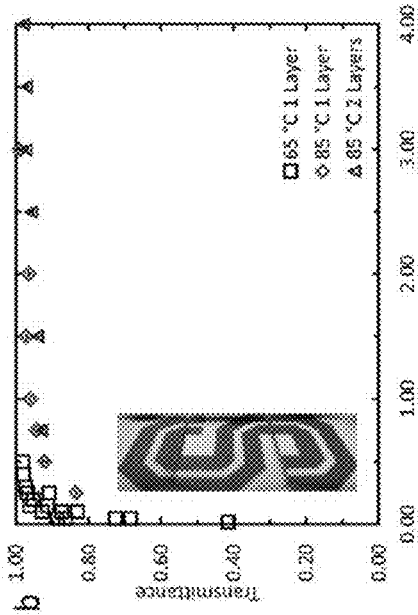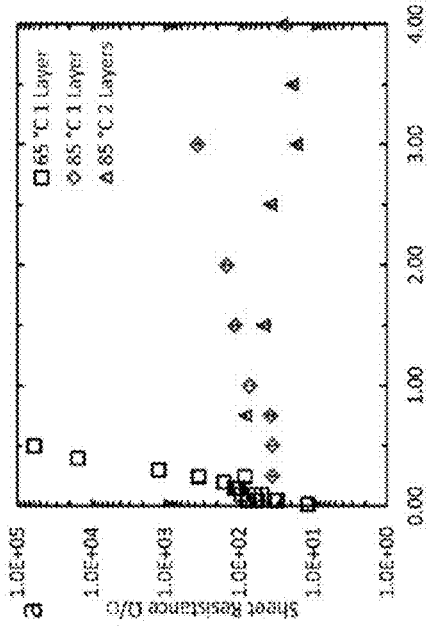
FIG. 3A
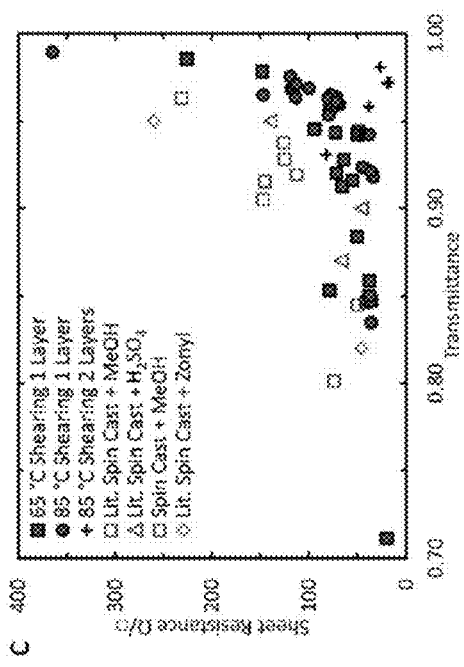
FIG. 3B
FIG. 3C

METHODS AND APPARATUS CONCERNING SOLUTION SHEARING A TRANSPARENT AND CONDUCTIVE POLYMER FILM

FEDERALLY-SPONSORED RESEARCH AND DEVELOPMENT

This invention was made with Government support under contract DE-EE0005960 awarded by the Department of Energy. The Government has certain rights in the invention.

OVERVIEW

Aspects of the present disclosure are believed to be applicable to a variety of different types of devices, systems and arrangements involving tunably solution shearing a conductive polymer film. Solution shearing includes coating a portion of a substrate with a polymeric conductor material and providing a shearing blade on the portion of the substrate coated with the polymeric conductor material. The conductive polymer film is formed by moving the shearing blade in a direction, to generate shear stress to the polymeric conductor material.

One or more of the items depicted in the present disclosure can also be implemented in a more separated or integrated manner, or removed and/or rendered as inoperable in certain cases, as is useful in accordance with particular applications. Those skilled in the art will recognize that many changes may be made thereto without departing from the spirit and scope of the present invention.

Various embodiments of the present invention may be more completely understood in consideration of the following description, which includes the Appendix that forms part of the provisional patent document and which is fully incorporated herein by reference.

BRIEF DESCRIPTION OF THE FIGURES

Various example embodiments may be more completely understood in consideration of the following detailed description and in connection with the accompanying drawings, in which:

FIGS. 3A-3D show examples of optimized properties of a transparent and conductive polymeric film according to various embodiments of the present disclosure;

Figure 1:
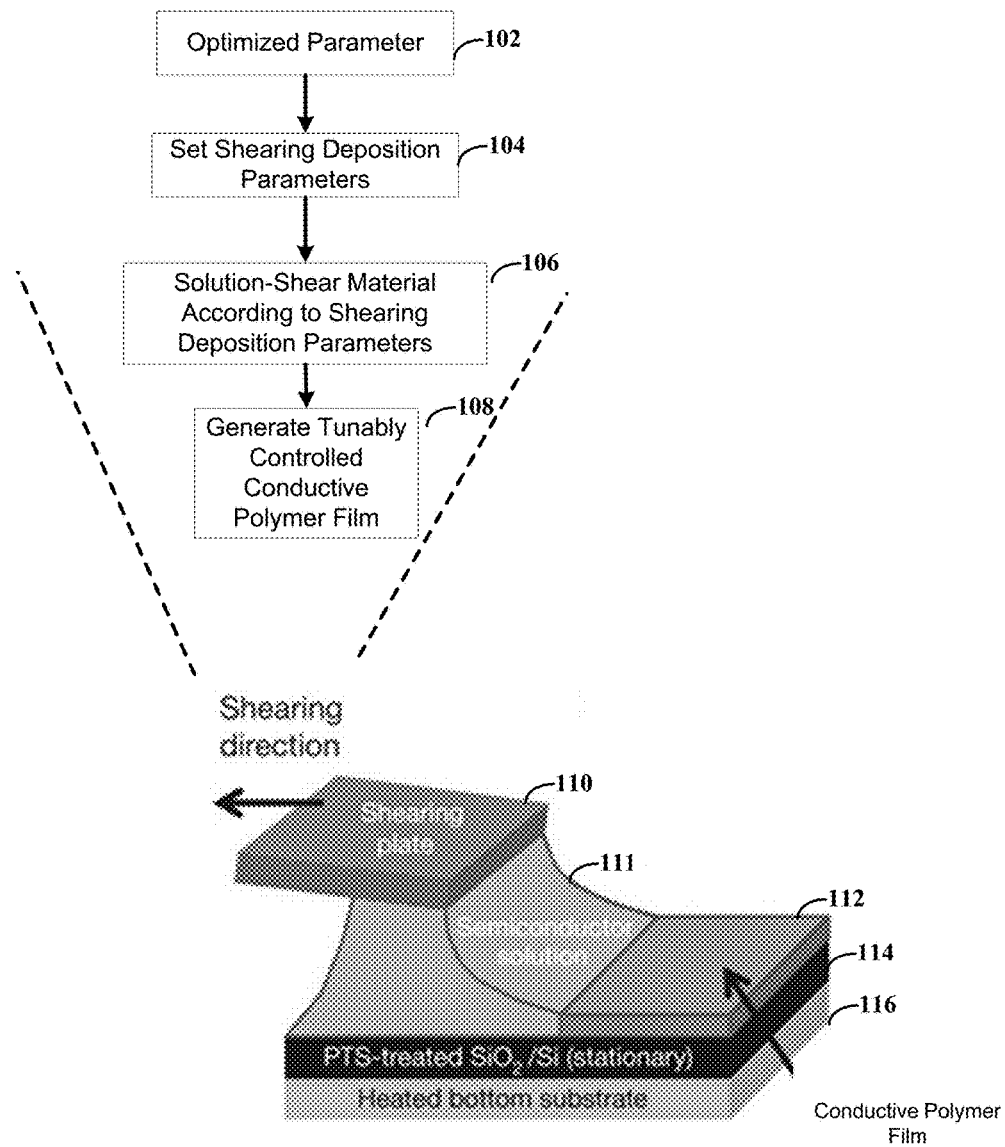
FIG. 1 shows an example process of solution shearing according to various embodiments of the present disclosure.

While various embodiments discussed herein are amenable to modifications and alternative forms, aspects thereof have been shown by way of example in the drawings and will be described in detail. It should be understood, however, that the intention is not to limit the invention to the particular embodiments described herein. On the contrary, the intention is to cover all modifications, equivalents, and alternatives falling within the scope of the disclosure including aspects defined in the claims. In addition, the term "example" as used throughout this application is only by way of illustration, and not intended to limit the scope of the present disclosure.

DETAILED DESCRIPTION

Aspects of the present disclosure are believed to be applicable to a variety of different types of apparatuses, systems and methods directed to solution shearing a transparent and conductive polymer film based on solution-shearing parameters. Specific embodiments are believed to be particularly advantageous for tuning shearing-deposition parameters to optimize a property of the solution-sheared conductive polymer film. In accordance with various specific embodiments, the transparent and conductive polymer film generated is used in and/or patterned as electrodes for use in optoelectronic devices, capacitive touch sensors, and energy conversion devices, among other devices. These and other aspects can be implemented to address challenges, including those discussed in the background above. While not necessarily so limited, various aspects may be appreciated through a discussion of examples using such exemplary contexts.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

Conductive films of optical transparency can be used in a myriad of applications, including electromagnetic shielding, antistatic layers, lighting displays, touch sensors, and as electrodes for photovoltaics. For example, consumer electronics are transitioning towards flexible and/or transparent products. Example applications include solar cells and touch screens for televisions and electronic devices, that use coatings that are both optically transparent and electrically conductive. Such transparent conductors can be formed of Indium tin oxide, which is expensive, and/or are solution sheared. Embodiments in accordance with the present disclosure include a scalable fabrication process through solution shearing that allows for tunable deposition conditions and which enables kinetic control, results in impacts on the electrical performance, and can be mass produced. Solution shearing includes coating a portion of a substrate with a polymeric conductor material and providing a shearing blade on the portion of the substrate coated with the polymeric conductor material. The transparent and conductive polymer film is formed by moving the shearing blade in a direction, to generate shear stress to the polymeric conductor material.

Various embodiments include a solution-based shearing deposition technique that creates a unique structuring of the resulting polymer. The polymer can be patterned as transparent electrodes for use in various applications. The resulting transparent and conductive polymer film, for example, has enhanced electrical conduction, such as in the order of 1 S/cm. Furthermore, the solution-shearing deposition may not include high temperature application of the conductive film coatings. In some specific embodiments, the transparent and conductive polymer film can have a sheet resistance of less than 100Ω/□, transmissivity of greater than 0.90, and can be inherently flexible. For example, transparent and conductive polymer films can have a conductivity in a range of 1 S/cm and 9230 S/cm, a sheet resistance in a range of 16.9 to 100Ω/□, at a transmissivity in a range of 0.9-0.976.

Various apparatus/method embodiments in accordance with the present disclosure further includes an apparatus resulting from manufacturer of a transparent and conductive polymer film having an optimized property. For example, a transparent and conductive polymer film is tunably generated on a substrate by solution shearing according to shearing deposition parameters. In certain embodiments, the tunable control includes controlling the shearing deposition parameters to optimize a property of the resulting conductive polymer. The optimized property, in some embodiments, includes tunable phase separation, polymer backbone alignment, electrical conductivity, kinetic control, and/or optical transparency of the transparent and conductive polymer film. In certain embodiments, the controlled shearing deposition parameters include sheer speed, thickness of the coating of the polymeric conductor material, a temperature of the polymeric conductor material, and/or a temperature of the substrate, and/or selectively patterning solvent wetting and de-wetting regions of the transparent and conductive polymer film on the substrate.

Various other embodiments are directed to an apparatus, system, method of use, method of making, or material directed to one or more of the following aspects, as may be implemented separately or in connection with one or more of the following aspects or other embodiments discussed and/or shown herein. Certain aspects of the instant disclosure are directed to coating a portion of a substrate with a polymeric conductor material and providing a shearing blade on the portion of the substrate coated with the polymeric conductor material. Further, aspects of the disclosure include tunably controlling generation of a transparent and conductive polymer film on the substrate by moving the shearing blade in a direction, to generate shear stress to the polymeric conductor material, and according to shearing deposition parameters. The tunable control can include controlling a back orientation, local ordering, and/or phase separation of the polymer film formed from the polymeric conductor material, and/or selectively patterning solvent wetting and de-wetting regions of the transparent and conductive polymer film on the substrate.

In various related aspects, the various embodiments can include additional steps and/or features to generate a transparent and conductive polymer film that has an optimized property. For example, the shearing blade, in a number of embodiments, includes patterned pillars. The pillars can be a variety of shapes including three-dimensional structures, such as cubes, cylinders, pyramids, prisms, triangular prisms, cones, hexagonal prisms, rectangular prisms, among other geometric shapes. In other related aspects, in order to obtain an optimized electrical conductivity of the transparent and conductive polymer film, the substrate with the transparent and conductive polymer film is solution shearer and then is rinsed with a chemical mixture. The chemical mixture, for example, includes methanol, ethanol, and/or a methanol and ethanol mixture, among other mixtures.

A related example embodiment includes an apparatus resulting from the manufacturer. In various embodiments, the apparatus includes a substrate and a transparent and conductive polymer film. The transparent and conductive polymer film is arranged on the substrate and has an optimized property. Further, the transparent and conductive polymer film is formed according to shearing deposition parameters of a shearing process used to deposit the transparent and conductive polymer film on the substrate. In a number of specific embodiments, solvent wetting and de-wetting regions are formed on the substrate prior to solution shearing the transparent and conductive polymer film. In accordance with various specific embodiments, the conductive polymer film is used to pattern electrodes. Such electrodes can be used in optoelectronic devices, capacitive touch sensors, and energy conversion devices, among other devices.

Turning now to the figures, FIG. 1 shows an example process of solution shearing according to various embodiments of the present disclosure. The process illustrated by FIG. 1 can be used to generate a transparent and conductive polymer film 112. The transparent and conductive polymer film 112 can be optically transparent and used in a variety of different applications, including electromagnetic shielding, antistatic layers, light displays, touch sensor, and as electrodes for photovoltaics. For example, light weight displays that are flexible and mechanically robust can be beneficial for use in televisions and other consumer electronics (e.g., cellphones, smartwatches, etc.) In various embodiments, the resulting transparent and conductive polymer 112 film surprisingly has a sheet resistance of less than 100Ω/□, transmissivity of greater than 0.90, and is inherently flexible.

The process can allow for deposition of a transparent and conductive polymer film 112 by solution-shearing a polymeric conductor material 111 on a substrate 114, 116 according to shearing deposition parameters. For example, at 102, one or more parameters for the generated transparent and conductive polymer film 112 can be optimized. Optimizing the parameter(s) can include identifying a value and/or range for optimization of the parameter. Shearing deposition parameters include or refer to characteristics or factors of the shearing deposition. Example shearing deposition parameters include a deposition rate (e.g., speed), thickness of the coating of the polymeric conductor material (e.g., the solution), a temperature of the polymeric conductor material, and/or a temperature of the substrate. The shearing deposition parameters can be controlled and/or otherwise changes to optimize a property of the transparent and conductive polymer film. A property of the transparent conductive polymer film includes or refers to a characteristic of the resulting polymer film. Example properties of the transparent and conductive polymer film include electrical conductivity, optical transparency, phase separation, backbone alignment, and/or kinetic control of the conductive polymer film. Different parameters may be optimized for different uses of the resulting transparent and conductive polymer film 112. For example, in certain applications, a particular conductivity, resistance, transmissivity, and combinations thereof, values may be useful for consumer electronics, optical applications, and/or electrode use.

Based on the optimized parameter, at 104, shearing deposition parameters are set. The different shearing deposition parameters can have different impacts on different properties. For example, the shearing speed can affect the sheet resistance, transmissivity, conductivity, and degree of alignment of the resulting transparent and conductive polymer film 112, among other parameters. The substrate (e.g., heated bottom substrate 116) temperature can affect the transmissivity and sheet resistance, among other parameters. The thickness of the coating of the polymeric conductor material can impact the transmissivity and conductivity, among other parameters. Further, treatment of the transparent and conductive polymer film 112 can impact the phase separation and conductivity, among other parameters. Such impacts are further illustrated and described herein.

The shearing deposition parameters can result in tunable control of the backbone orientation of the resulting transparent and conductive polymer film, local ordering, and phase separations, as further described herein. In various embodiments, the transparent and conductive polymer film can have conductivities of up to 4600±100 S/cm, a sheet resistance of 17±Ω/□, and/or at a transmission of 97.2±0.4 percent.

As illustrated, at 106, the polymeric conductor material is solution sheared according to set shearing deposition parameters. In various embodiments, solution shearing includes coating a portion of the substrate 114, 116 (e.g., the stationary portion 114) with a polymeric conductor material 111 and providing a shearing blade 110 (sometimes herein referred to as a "shearing plate") on the portion coated with the polymeric conductor material 111. The transparent and conductive polymer film 112 is generated, at 108, by moving the shearing blade 110 in a direction, as illustrated by the arrow, to generate shear stress to the polymeric conductor material 111 and according to the shearing deposition parameters. The shearing blade can be flat, as illustrated by FIG. 1, and/or can include patterned pillars. The patterned pillars can include three-dimensional structures having shapes such as pyramids, prisms, cylinders, cubes, triangular prisms, cones, hexagonal prisms, rectangular prisms, among other geometric shapes.

In various embodiments, the transparent and conductive polymer film is generated by tunably controlling the generation using the shearing deposition parameters to optimize the one or more parameters (e.g., as identified at 102). The optimized property can include phase separation, polymer backbone alignment, electrical conductivity, kinetic control, optical transparency of the transparent and conductive polymer film, and a combination thereof. In some embodiments, the shearing deposition parameters are adjusted in order to optimize the property. The adjustment can include adjusting the shearing speed thickness of the coating of the polymeric conductor material, a temperature of the polymeric conductor material, a temperature of the substrate, and a combination thereof. As a few examples, adjusting a shearing speed can be used to optimize at least one of a resistance, a conductivity, a transmissivity, and a degree of alignment of the generated transparent and conductive polymer film. Adjusting a temperature of the substrate while generating the transparent and conductive polymer film can be to optimize at least one of a resistance and a transmissivity of the generated transparent and conductive polymer film.

In other specific embodiments, the optimization can include post-solution shearing processing of the transparent and conductive polymer film 112. In specific examples, the transparent and conductive polymer film 112 is rinsed with a chemical mixture. The chemical mixture can include methanol, ethanol, and/or a methanol and ethanol mixture. After rinsing the transparent and conductive polymer film 112 with the chemical mixture, the transparent and conductive polymer film 112 is further annealed. The rinse with the chemical mixture can be used to optimize phase separation and/or conductivity, among other properties, in various embodiments. For example, in specific embodiments, rinsing the transparent and conductive polymer film using a methanol and ethanol mixture can be used to optimize conductivity of the generated transparent and conductive polymer film 112.

In other embodiments, optimization of one or more properties can include a pre-solution processing of the substrate (e.g., the stationary substrate 114) to include hydrophilic and hydrophobic regions. In certain specific applications, lateral patterning of electrodes can be beneficial for certain electronic devices, such as circuits and sensors (or sensor circuits). The hydrophilic and hydrophobic regions can be used to pattern the transparent and conductive polymer film 112 in lateral patterns (e.g., rectangles and/or blocks). Using the hydrophilic and hydrophobic regions, a post-deposition lithographic process can be avoided, which can damage the resulting transparent and conductive polymer film 112. Prior to shearing, defined patterns of the hydrophilic and hydrophobic areas can prepared on the substrate surface. In specific embodiments, as the polymeric conductor material is sheared, the meniscus is confined and pinned within the hydrophilic region, resulting in selective film deposition.

The resulting apparatus from the above-described process includes a substrate and a transparent and conductive polymer film 112. The transparent and conductive polymer film 112 is arranged on the substrate and has (e.g., exhibits) an optimized one or more properties and formed according to the shearing deposition parameters of the solution-shearing process used to deposit the transparent and conductive polymer film 112. The transparent and conductive polymer film 112 can be used to form and be part of various electronic devices. For example, one or more transparent electrodes can be patterned and formed using the transparent and conductive polymer films 112. In other embodiments, the deposition parameters results in patterns of the transparent and conducive polymer film in lateral patterns between the de-wetting regions on the substrate. The polymer film generated is used in and/or patterned as electrodes for use in optoelectronic devices, capacitive touch sensors, and energy conversion devices, among other devices. As further illustrated and described herein, the transparent and conductive polymer film 112 generated includes defined fibers that form an interconnected mesh network, and which can be useful in the above-listed applications. Furthermore, in various embodiments, the resulting polymer film includes phase separation between different material forming the film (e.g., phase separation between PSS and PEDOT, wherein PEDOT is dominated at a location proximal to the substrate).

Figure 2A:
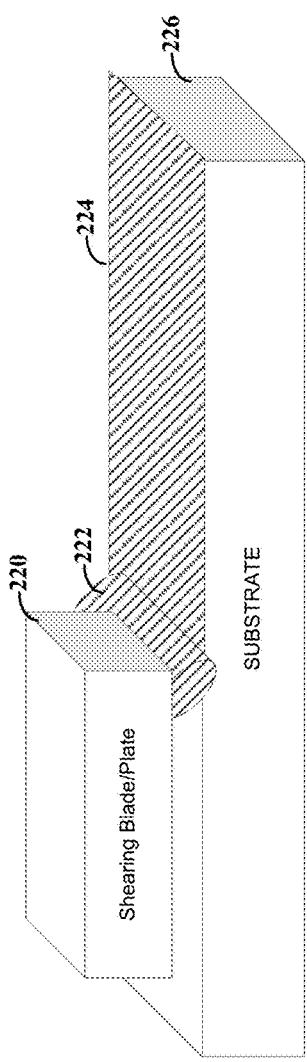
FIG. 2A shows an example process of solution shearing according to various embodiments of the present disclosure.

FIG. 2A shows an example process of solution shearing according to various embodiments of the present disclosure. The process can include tunably controlling the generation using the shearing deposition parameters to control a back orientation, local ordering, and/or phase separation of the polymer film formed from the polymeric conductor material. As illustrated, a portion of the substrate 226 is coated with a polymeric conductor material 222. A shearing blade (or plate) 220 is provided on the portion of the substrate 226 with the polymeric conductor material 222. A transparent and conductive polymer film 224 is tunably controlled and generated by moving the shearing blade 220 in a direction. The movement of the shearing blade 220 generates shear stress (e.g., forces) to the polymeric conductor material 222 resulting in the transparent and conductive polymer film 224. The generation of the transparent and conductive polymer film is controlled according to shearing deposition parameters that are set to optimize a property of the resulting transparent and conductive polymer film 224, as previously described in connection with FIG. 1.

Figure 2B:
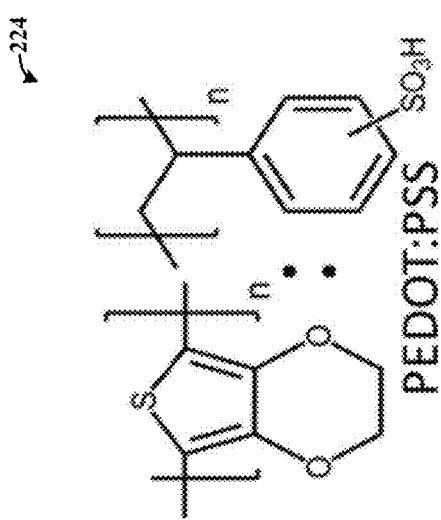
FIG. 2B shows a chemical structure of an example polymeric conductor material formed by the solution shearing process shown by FIG. 2A, according to various embodiments of the present disclosure.

FIG. 2B shows a chemical structure of an example transparent and conductive polymer film 224 formed by the solution shearing process shown by FIG. 2A, according to various embodiments of the present disclosure. The transparent and conductive polymer film 224 is transparent and flexible, as described above. The polymeric conductor material and resulting transparent and conductive polymer film 224 can be poly(3,4-ethylenedioxythiophene):poly(styrenesulfonate) (PEDOT:PSS).

PEDOT:PSS is a polymer mixture of two ionomers: poly(3,4-ethylenedioxythiophene) (PEDOT) and a sulfonated polystyrene (PSS). Part of the sulfonyl groups of the PSS can be deprotonated and can carry a negative charge, wherein the PEDOT can carry a positive charge. Thereby, PEDOT-PSS consists of insoluble PEDOT that is charge stabilized by PSS.

PEDOT:PSS can be soluble in aqueous solutions. Within such aqueous solutions, PEDOT:PSS can form micelles where the hydrophilic PSS is in contact with water and the hydrophobic PEDOT is located in the micelle core. Upon spin-coating from solution, the micelles are deposited as films and can have conductivity on an order of 1 S/cm. Subsequent annealing, treatment with co-solvents, and post-processing steps can increase the conductivity of the films to over 3000 S/cm. In various instances, spin cast PEDOT:PSS can have a sheet resistance of 46Ω/□ at 90 percent transmission and can be compatible with flexible electronics as the films can withstand 90% (or more) applied strain without electrical breakdown.

Solution shearing the PEDOT:PSS, in accordance with various embodiments, can allow for tunable deposit conditions resulting in control on electric performance of the resulting film. Spin casting, by contrast, can be different to controls, particular on mass production scale. The tunable deposit conditions are herein referred to as shearing deposition parameters.

Figure 2C:
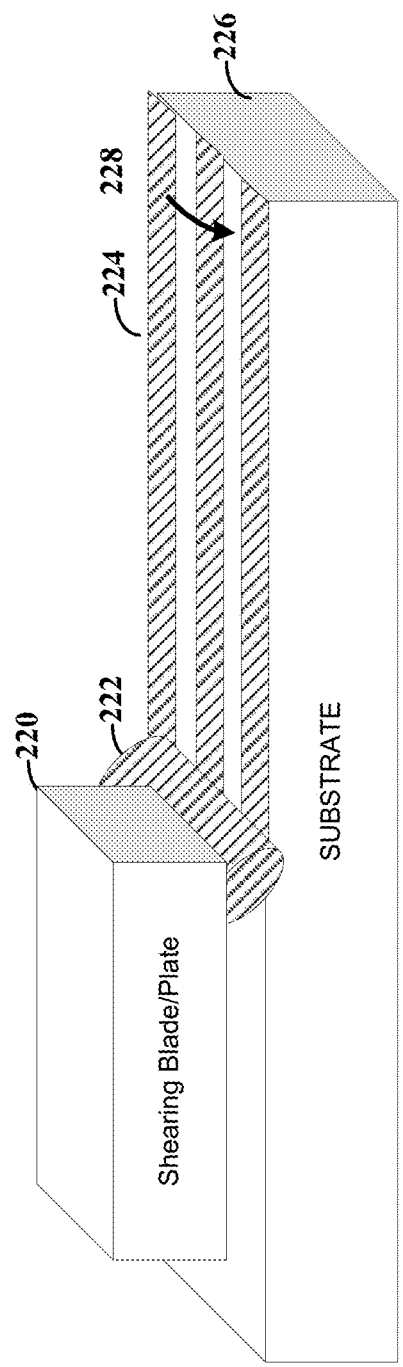
FIG. 2C shows an example process of solution shearing to optimize a particular property according to various embodiments of the present disclosure.

FIG. 2C shows an example process of solution shearing to optimize a particular property according to various embodiments of the present disclosure. A patterning method can be used to enable conductivity of particular values of the resulting transparent and conductive polymer film which is transparent and can be used in capacitive pressure sensors and organic photovoltaic (OPV) devices. As illustrated, a patterning of solvent wetting and de-wetting regions 228 (e.g., the hydrophobic and hydrophilic regions previously described) can be located on the substrate 226. As previously described, solvent wetting and de-wetting regions 228 can be used to pattern the transparent and conductive polymer film 224 in lateral patterns (e.g., rectangles and/or blocks). The resulting transparent and conductive polymer film includes patterns of transparent and conductive polymer film 224 in lateral patterns between de-wetting regions 228 on the substrate 226. Prior to shearing, defined patterns of solvent wetting (e.g., located where the polymer film 224 is shown) and de-wetting regions 228 can be prepared on the substrate surface. In specific embodiments, as the polymeric conductor material is sheared, the meniscus is confined and pinned within the solvent wetting region, resulting in selective film deposition. Accordingly, the shearing deposition parameters can include selectively patterning solvent wetting and de-wetting regions on the substrate prior to shearing the polymeric conductor material.

FIGS. 3A-3D show examples of optimized properties of a transparent and conductive polymer film according to various embodiments of the present disclosure. The shearing deposition parameters that are tunably controlled to optimize one or more properties of the polymer film can include the shearing speed, temperature of a polymeric conductor material, and layers of the polymeric material. Further, in some specific embodiments, the shearing deposition parameters can include use of a shearing blade with patterned pillars, use of solvent wetting and de-wetting regions, and/or post-solution shearing processing.

FIG. 3A illustrates the sheet resistance of a resulting PEDOT:PSS film deposited at different shearing speeds (e.g., 0.00 to 4.00 mm/s) on glass substrates at different temperatures (e.g., single layer of PEDOT:PSS at 65 degrees C., single layer of PEDOT:PSS at 85 degrees C., and double layers of PEDOT:PSS at 85 degrees C.). As illustrated by FIG. 3A, in specific embodiments, at 65 degrees C. there is an increase in sheet resistance of the films at the faster shearing speeds within the range. This is consistent with depositing thinner films at relatively higher shearing speeds, resulting in higher resistances (e.g., as compared to lower shearing speeds). When the substrate temperature is increased to 85 degrees C., there appears to be a flat response between the increase in shearing speed and sheet resistance. PEDOT:PSS film thickness can decrease from 95±2 nm to 41±2 nm when increasing the shearing speed from 0.5 mm/s to 1.5 mm/s. The film thickness can increase at 2 mm/s (to 53±2 nm) shearing speed which is believed to indicate the PEDOT:PSS processing is changing from the evaporative to the Landau Levich regime.

FIG. 3B illustrates the transmittance of a resulting PEDOT:PSS film deposited at different shearing speeds (e.g., 0.00 to 4.00 mm/s) on glass substrates at different temperatures (e.g., single layer of PEDOT:PSS at 65 degrees C., single layer of PEDOT:PSS at 85 degrees C., and double layers of PEDOT:PSS at 85 degrees C.). Specifically, FIG. 3B illustrates the effect of the shearing speed on the transmissivity at 440 nm of a PEDOT:PSS film at 65 degrees C. and 85 degrees C. The film transmission can range from 83.5±0.2 percent to 97.1±0.2 percent for increasing sheering speeds from 0.5 mm/s to 1.5 mm/s. In specific embodiments, the film thickness begins to increase at 2 mm/s, and the corresponding film transparency begins to decrease to 96.5±0.3 percent. Tuning the temperature of the substrate and the sheering speed can allow for optimization of film thickness, sheet resistance, and transparency.

FIG. 3C illustrates an example sheet resistance and transmittance of PEDOT-PSS films sheared at different temperatures (e.g., 65 degrees C., 85 degrees C., and two layers at 85 degrees C.) as compared to spin casting PEDOT-PSS films with methanol, H2SO4, and Zonyl fluorosurfactant. As illustrated, shearing PEDOT:PSS at both 65 degrees C. (e.g., solid squares) and 85 degrees C. (e.g., solid circles) outperform spin coated PEDOT:PSS films (all methanol treated) in sheet resistance and/or transparency. Sheared PEDOT:PSS films at 85 degrees C., in some experimental embodiments, can result in reliable deposition, as evidenced by the clustering of the data points.

Figure 3D:
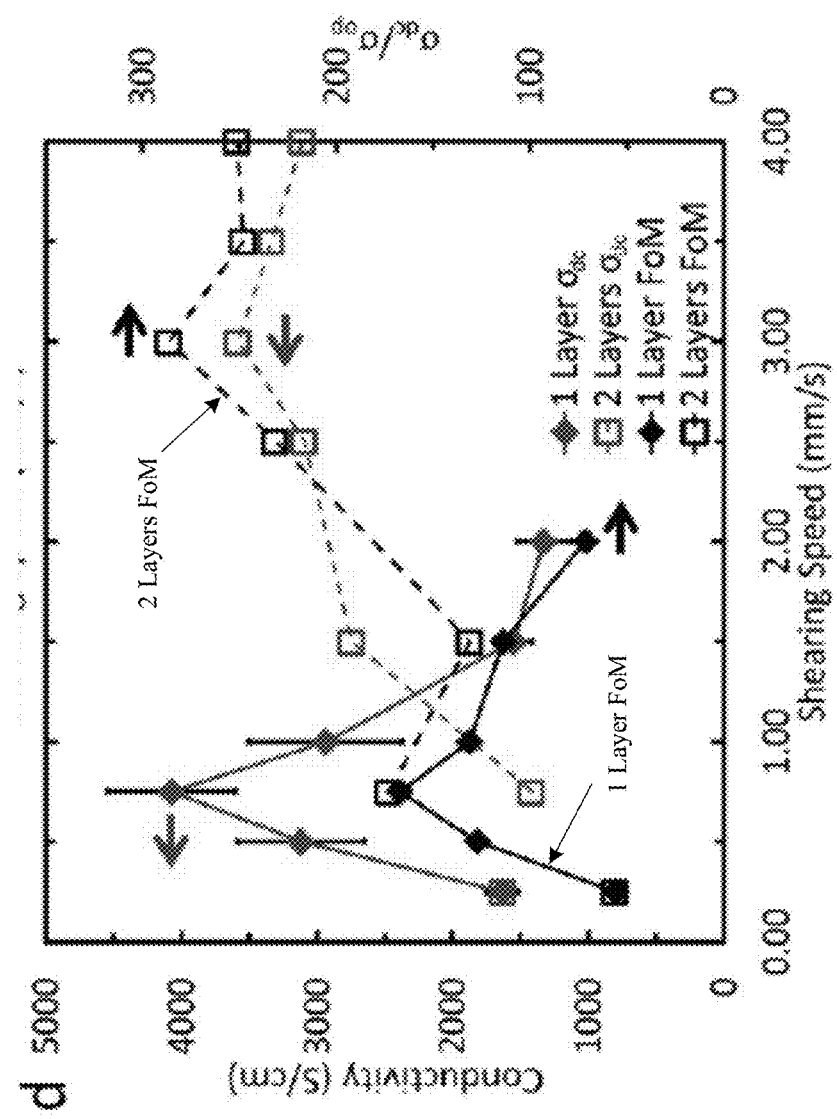

FIG. 3D illustrates the conductivity and $\sigma_{DC}/\sigma_{op}$ ratio of single and double layered PEDOT:PSS films sheared at 85 degrees C. A single layer PEDOT:PSS film, as illustrated by the diamonds, can have a conductivity peak at 0.75 mm/s shearing speed. When the thickness of the film is increased by depositing a second layer of PEDOT:PSS, the conductivity peak (e.g., optimal conductivity) can occur at a shearing speed of 3.00 mm/s. For double layered films, the drop in conductivity with increase or decrease of the shearing speed can be less than compared to a single layered film.

The figure of merit (FOM) for transparent conductors can be defined as the ratio of direct current conductivity (e.g., $\sigma_{DC}$) to optical conductivity ($\sigma_{op}$), which can be defined as:

$$FoM = \frac{\sigma_{DC}}{\sigma_{op}(\lambda)} = \frac{188.5 \, \Omega}{R_{sheet}(T(\lambda)^{-1/2} - 1)}$$

Where $R_{sheet}$ is the sheet resistance and T is the transmittance at □=440 nm. FOM includes or refers to a quantity (e.g., $\sigma_{DC}/\sigma_{op}$) used to characterize the performance of a device, system or method, relative to its alternatives. In some instances, a FOM of greater 35 can be a minimum benchmark indicating commercial viability of transparent conducts. A FOM of 35 can constitute a sheet resistance of less than or equal to 100Ω/□ and transparency of greater than or equal to 90 percent. FIG. 3D illustrates an FOM for a single and double layer sheared PEDOT:PSS of different shearing speeds of a range of 0.02 mm/s to 4.00 mm/s. Surprisingly, in experimental embodiments, the FOM for each example sheared PEDOT:PSS film is greater than 35 and reached 286 for a double layered PEDOT:PSS sheared at 3 mm/s. Shearing transparent and conductive polymer film in accordance with various embodiments can improve an optical transparency while decreasing sheet resistance as compared to other techniques. For example, a FOM for a PEDOT:PSS that is treated with $H_2SO4$ can include 72 ($R_{sheet}$=46Ω/□ and T=0.90). In various embodiments, a PEDOT:PSS solution sheared at 2.5 mm/s and treated with methanol can result in films with $R_{sheet}$ of 38Ω/□ at T of 96 percent for a FOM of 232. By contrast, spin coated PEDOT:PSS films treated with methanol can have an $R_{sheet}$ of 112Ω/□ at T of 92 percent for a FOM of 39.

Figure 4A:
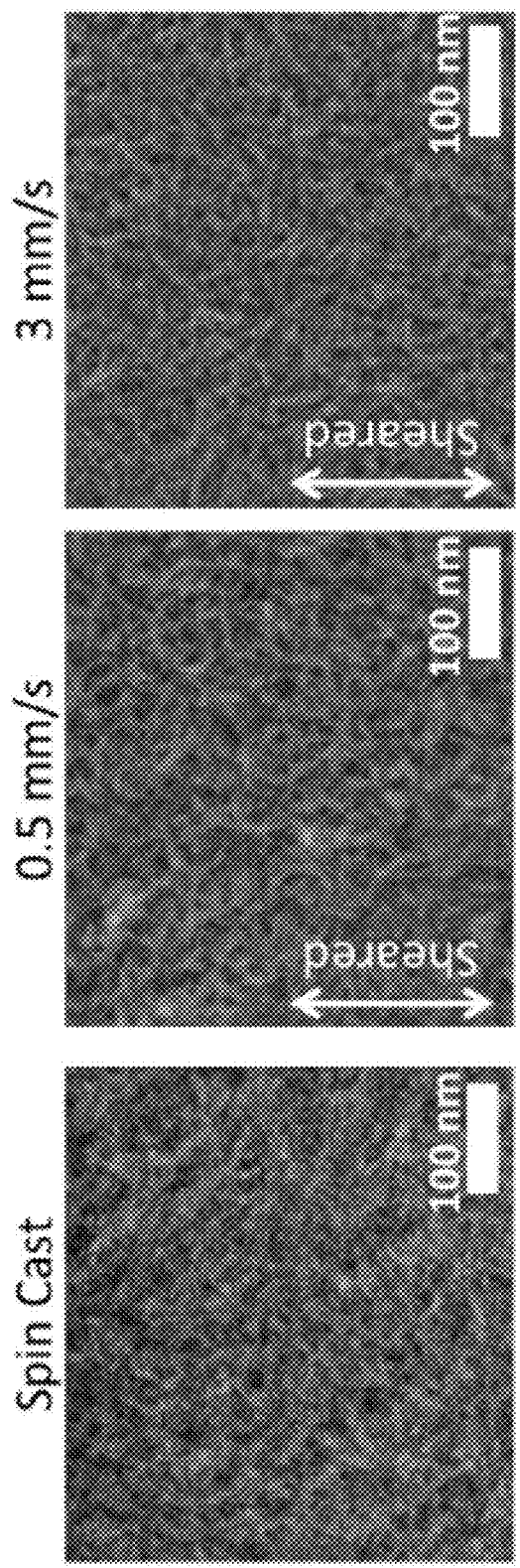
FIGS. 4A and 4B show examples of transparent and conductive polymeric film according to various embodiments of the present disclosure.
Figure 4B:
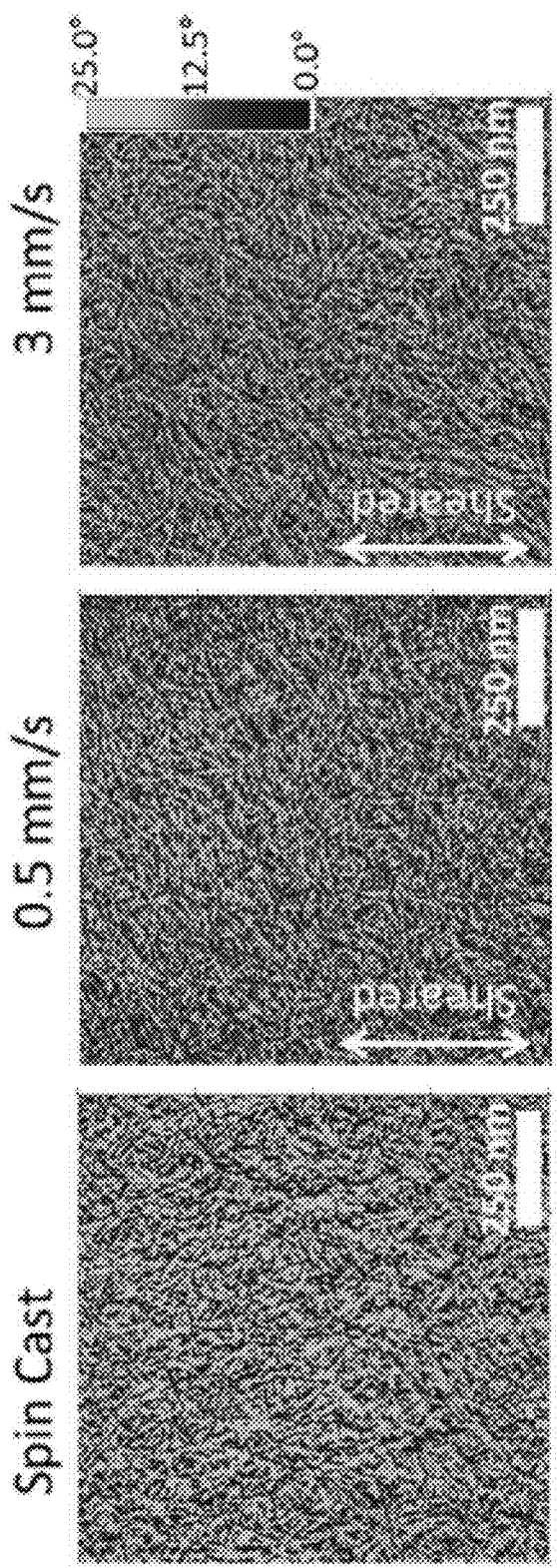

FIGS. 4A and 4B show examples of transparent and conductive polymer film according to various embodiments of the present disclosure. In various experimental and/or more specific embodiments, different deposition techniques can be used to deposit polymeric films. The effects of the different deposition techniques are illustrated by FIGS. 4A and 4B. FIG. 4A illustrates a scanning electron microscopy (SEM) image of a spin cast film, a shear deposited film with a shearing speed of 0.5 mm/s, and a shear deposited film with a shearing speed of 3 mm/s. FIG. 4B illustrates atomic force microscopy (AFM) images of the spin cast film, the shear deposited film with a shearing speed of 0.5 mm/s, and the shear deposited film with a shearing speed of 3 mm/s. As illustrated by the images of FIGS. 4A and 4B, the spin cast films, which are treated with methanol, show spherical particles (that are small) that are somewhat assembled into ill-defined short nanofibers. The shear deposited films show more defined fibers that become elongated with faster shearing speeds. While the sheared nanofibers may not have a preferential arrangement in the direction of the shearing, according to the example images, the fibrous networks form an interconnected mesh network. The interconnected mesh network may enable superior charge transfer.

Treatment of PEDOT:PSS with post solution chemical, such as methanol and/or a methanol and ethanol mixture, in various embodiments, can increase phase segregation between PEDOT and PSS domains and reduce excess PSS content. This can be evidenced through X-ray photoelectron spectroscopy (XPS) surface scans. XPS surface scans can provide various information and the scans can probe the chemical composition through a bulk of the film and can reveal the presents (or not) of vertical composition gradients. In various specific embodiments, XPS of the S 2p region of PEDOT:PSS can comprise two peaks with the sulfonate moiety from PSS (e.g., occurring at a higher binding energy) and the thiophene in PEDO (e.g., occurring at a lower binding energy).

Figure 5A:
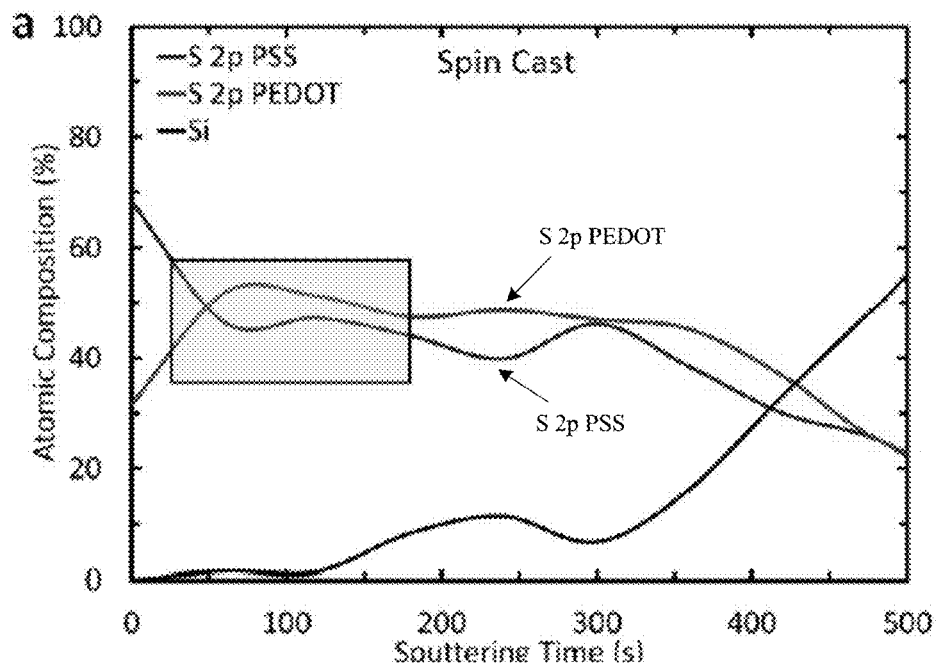
FIGS. 5A-5B show differences in transparent and conductive polymer film composition according to various embodiments of the present disclosure.
Figure 5B:
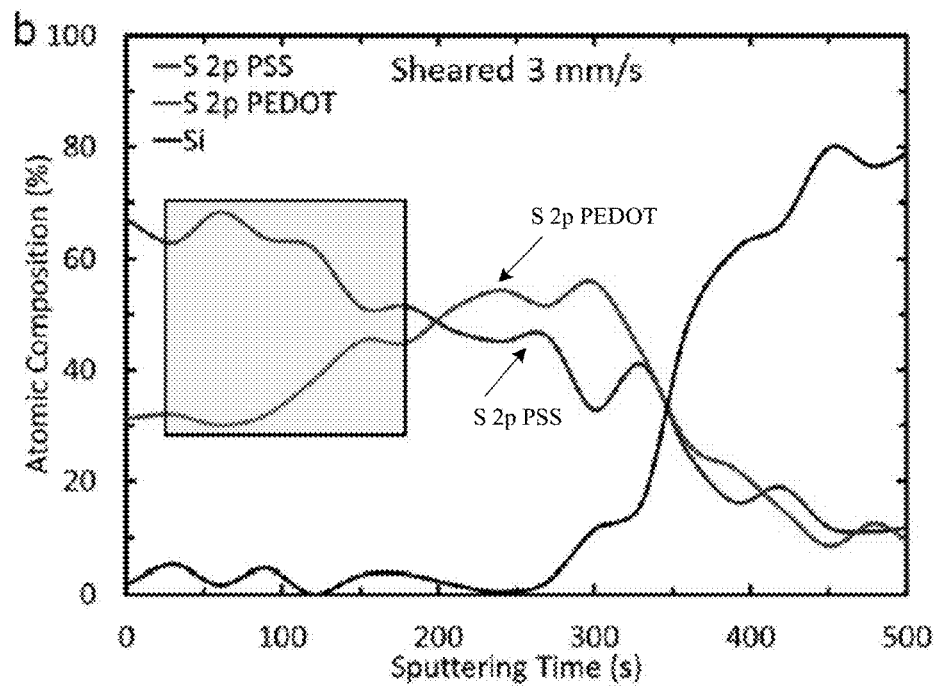

FIGS. 5A-5B show differences in PEDOT-PSS film composition according to various embodiments of the present disclosure. FIGS. 5A-5B illustrate XPS depth profiles that show different vertical phase gradients between the spin casting, illustrated by FIG. 5A, and shearing as illustrated by FIG. 5B. The boxes on the plots illustrate areas of threshold differences in the vertical compositions of films. As illustrated by FIG. 5A, spin coated films of PEDOT:PSS can be PSS rich and change to a near 1:1 ratio of PSS to PEDOT through the bulk of the film. As illustrated by FIG. 5B, sheared PEDOT:PSS can be top dominated by PSS and bottom dominated by PEDOT. Top, as used herein, refers to or includes the surface of the film that is proximal to the shearing blade and bottom refers to or include a surface inverse to the top of the film and/or that is proximal to the substrate. Sheared films can exhibit a greater extent of phase separation as compared to spin casting. Phase separation, as used herein, includes or refers to the segregation of the material forming the film (e.g., segregation of the PSS surface from the PEDOT rich layer beneath). The reduction of PSS content in and/or toward the bottom of the film can increase the conductivity of the film near the substrate interface. Further, sheared films with higher PSS surface concentration can aid in removal of the films, which can increase the films conductivity.

Figure 6B:
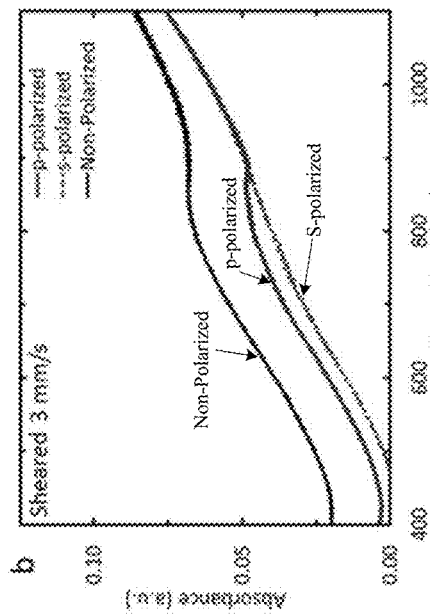
FIGS. 6A-6D show examples of optical anisotropy in transparent and conductive polymeric films according to various embodiments of the present disclosure.
Figure 6D:
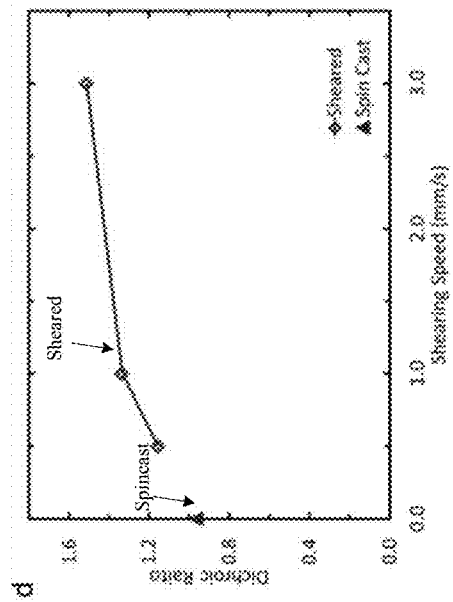
Figure 6A:
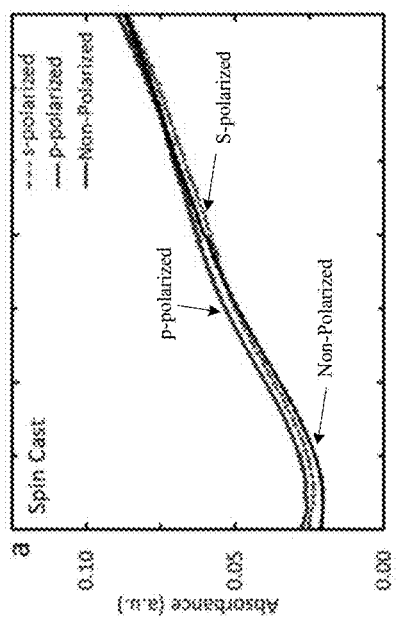
Figure 6C:
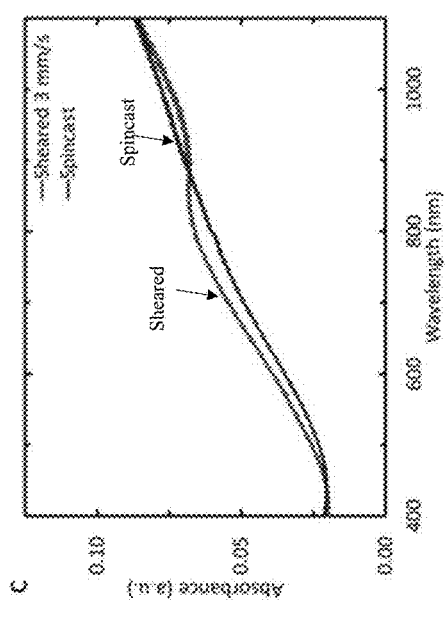

FIGS. 6A-6D show examples of optical anisotropy in conductive polymeric films according to various embodiments of the present disclosure. In specific experimental embodiments, polarized ultraviolet-visible (UV-vis) spectroscopy can be used to characterize the transparency and electronic transition. The electronic transitions can be correlated to molecular ordering and aggregation in polymer films. FIG. 6A illustrates polarized UV-vis absorption of spin cast PEDOT:PSS and FIG. 6B illustrates polarized UV-vis absorption of sheared PEDOT:PSS, which is sheared at 85 degrees C. at a shearing speed of 3 mm/s. FIG. 6C illustrates a comparison of non-polarized absorption of the sheared and spin cast films and FIG. 6D illustrates the dichroic ratio of spin cast and sheared films deposited with blade speeds of 0.5, 1.0, and 3.0 mm/s. Unpolarized absorption in sheared films may reveal a feature occurring near 800 nm that is not present in spin cast films, as illustrated by FIG. 6C. The electronic transition can be observed in doped PEDOT, which indicates the existence of a conductive (highly) phase in solution sheared films. This can indicate that the solution shearing deposition process, while better allowing for removal of PSS near the surface, can maintain the potency of the remaining PSS dopants. Furthermore, s-polarized absorption may not exhibit this transition, whereas p-polarization does. The anisotropic nature of the solution shearing process imparts an anisotropic structure within the deposited PEDOT:PSS film, which can align the conductive PEDOT. The degree of alignment can be compared with the dichroic ratio of the p-/s-polarized absorption at 800 nm. The dichroic ratio can be determined for shearing speeds of 0.5, 1.0, and 3.0 mm/s, as well as for spin casted films, in specific experimental embodiments. As illustrated by FIG. 6D, the sheared films have a dichroic ratio of greater than 1, whereas the spin cast film is close to 1. Additionally, the magnitude of alignment increases with increasing shearing speed (e.g., with 3.0 mm/s exhibiting the highest dichroic ratio in specific experimental embodiments). The shearing speed can correspond with optimized conditions for maximized double layer FOM.

Figure 7:
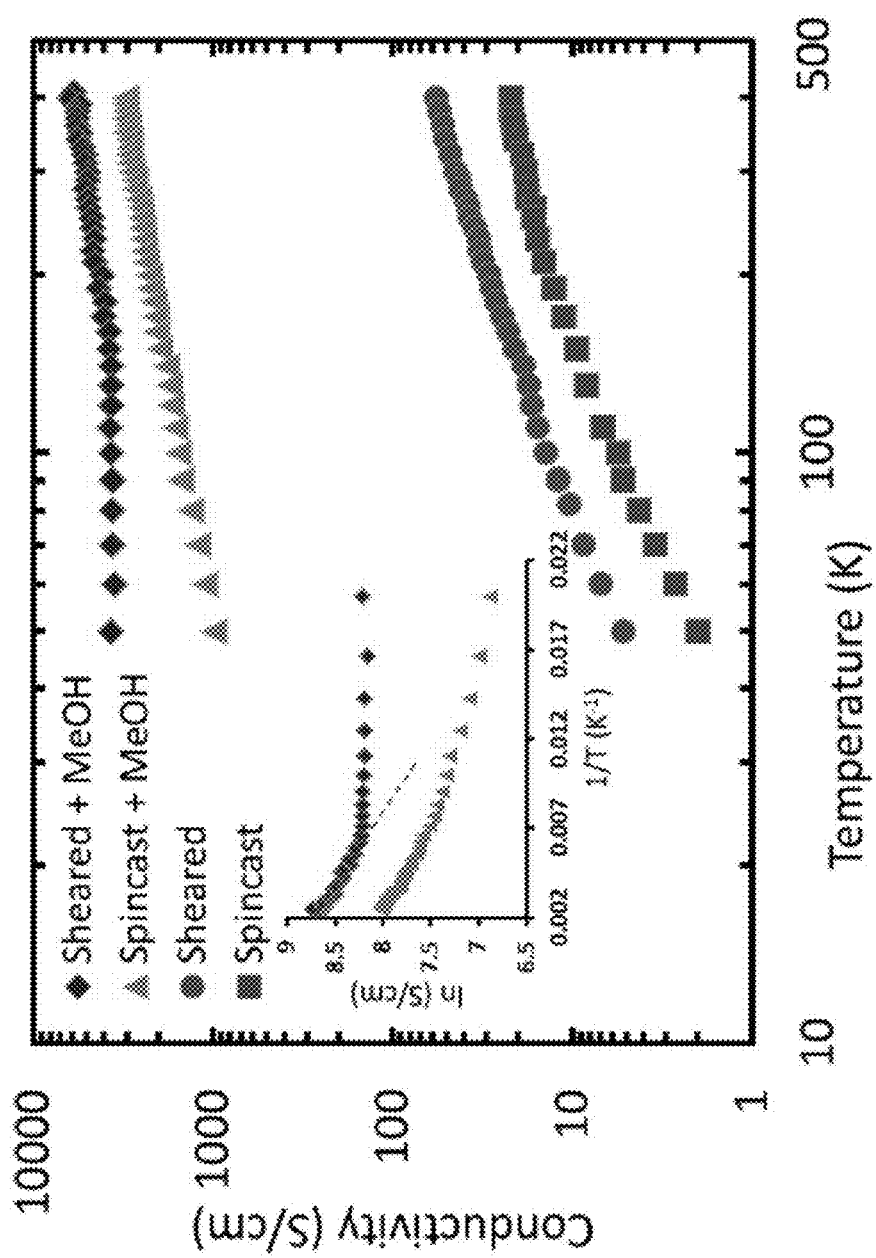
FIG. 7 shows temperature dependence conductivity of a transparent and conductive polymeric film according to various embodiments of the present disclosure.

FIG. 7 shows temperature dependence conductivity of a conductive polymeric film according to various embodiments of the present disclosure. In various embodiments, a methanol post processing treatment can be used to increase conduction of a solution shearing process. Treatment with methanol increases conductivity in both spin casted and solution sheared films, by over 2 orders magnitude, with the solution sheared films exhibiting higher overall conductivity. Additionally, two slopes can be observed, one above and one below 160K in methanol-treated solution sheared films, which can indicate a switching of the dominant hole scattering process below 160K. The change is illustrated in the blown up Arrhenius plot of FIG. 7. Solvent-treated films can increase the ordering and shorten inter-polymer distances, in various embodiments. While the methanol treatment has an effect on the PEDOT:PSS films, the increased ordering provided by the solution shearing process can further enhance electrical properties as compared to spin casted films. Embodiments are not limited to methanol post processing treatment and can include various other chemical mixtures. For example, as further illustrated and described herein, the mixture can include a methanol and ethanol mixture.

Figure 8A:
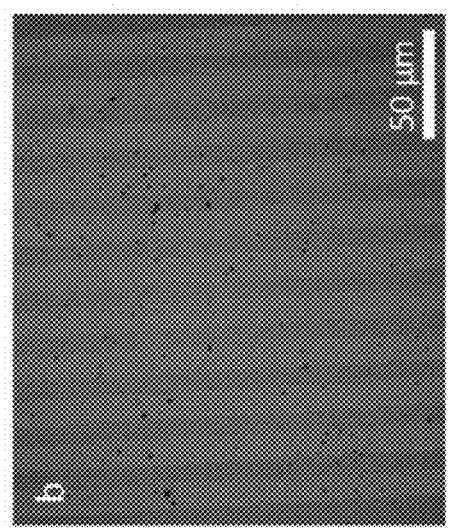
FIGS. 8A-8D show application of a solution-sheared conductive polymeric film according to various embodiments of the present disclosure.

FIGS. 8A-8D show application of a solution-sheared conductive polymeric film according to various embodiments of the present disclosure. The high conductivity of solution sheared PEDOT:PSS films can render the films as beneficial material for transparent conductors for various device. The quality interface can be useful for OPV device. For example, the conductive sheared PEDOT:PSS films can be applied as an anode in OPV device, where the device architecture can contain a poly(3-hexylthiophene) (P3HT):[6,6]-phenyl-$C_{61}$-butryic acid methyl ester ($PC_{61}BM$) photoactive layer and LiF/Al cathode. The current density-voltage (J-V) plots are shown by FIG. 8A.

Sheared PEDOT:PSS electrodes can obtain a power conversion efficiency (PCE) of 2.87% which is similar to using ITO TCs (2.86%). The ITO electrodes can have higher open-circuit voltages (VOC) and short-circuit current densities (JSC), but a lower fill factor (FF). High fill factors for sheared PEDOT:PSS devices can be attributed to the low sheet resistance of TC films, and potentially improve bulk heterojunction morphology in the photoactive layer. Spin cast PEDOT:PSS films may have a PCE of 2.20% with lower JSC and FF compared to sheared films. The reduction in these photovoltaic parameters can be the result of high sheet resistance and lower transparency of spin cast PEDOT:PSS TCs. The similar photovoltaic performance of sheared PEDOT:PSS and ITO transparent electrodes indicates that solution sheared PEDOT:PSS electrodes can be a cost-effective alternative to ITO in OPV devices.

Figure 8B:
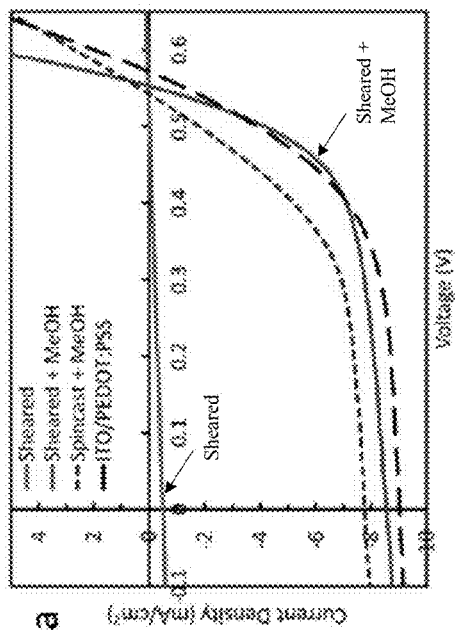

While some applications may use conformal coatings, lateral patterning of electrodes can be used for fabrication of some device structures, such as circuits and sensors. Various embodiments include depositing the PEDOT:PSS films into patterns. The patterns can prevent use of post-deposition lithographic processes that can damage the film. Prior to shearing, defined patterns of hydrophilic and hydrophobic areas can be prepared on the substrate surface. As the PEDOT:PSS solution is sheared, the meniscus is confined and pinned within the hydrophilic region, resulting in selective film deposition. FIG. 8B is an optical image of patterned PEDOT:PSS film. Line width and spacing as small as 2 μm can be achieved with this methodology.

Figure 8C:
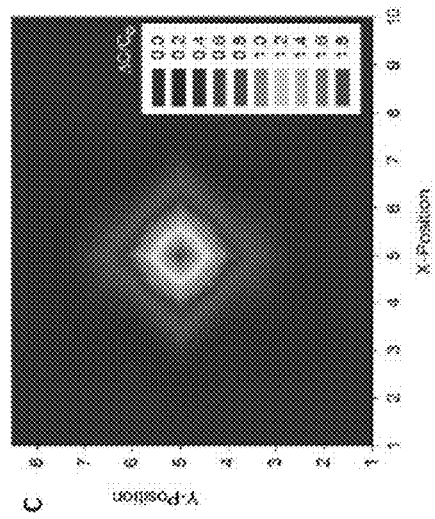
Figure 8D:
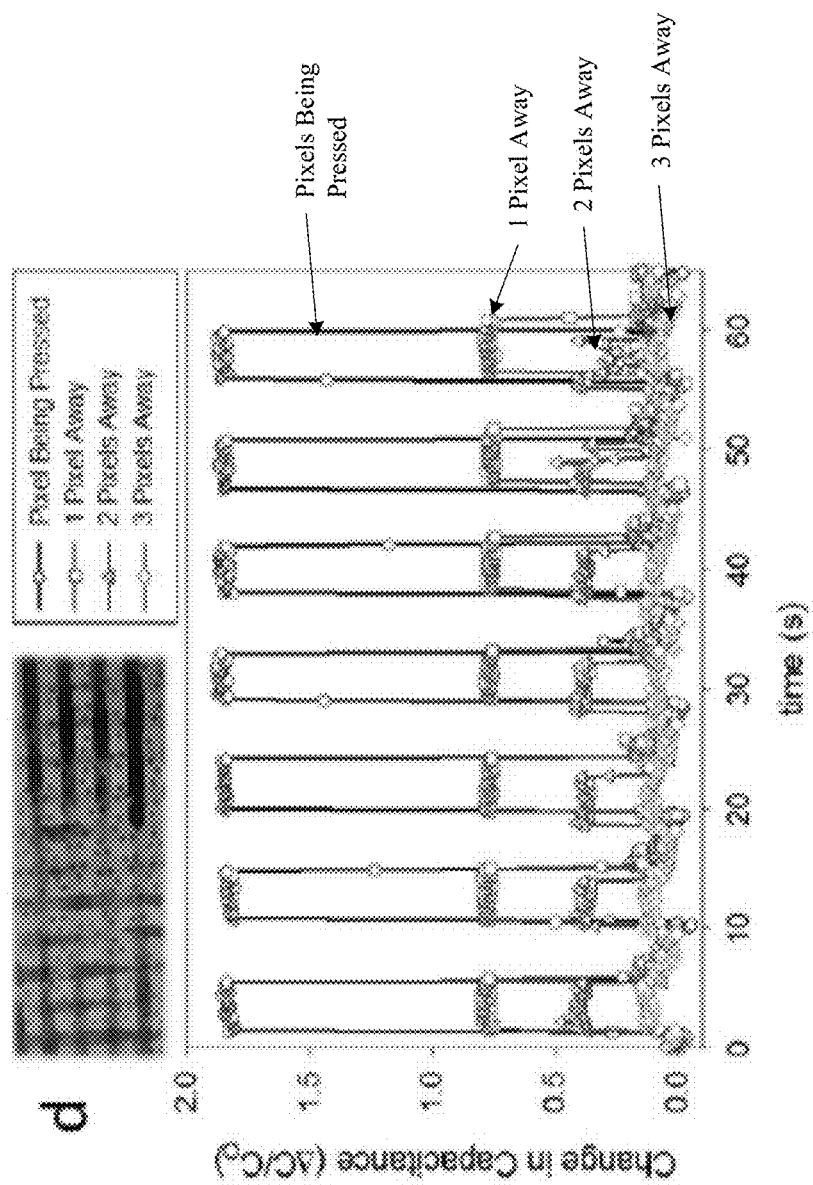

A specific embodiment of patterned electrodes using solution sheared polymer film is 2-dimensional position pressure sensor. In an experiment embodiment, ten electrodes are patterned in parallel on PET with width and spacing of 5 mm. A PDMS spacer separates two coated PET substrates aligned perpendicular to each other as illustrated by the top of FIG. 8D. The middle pixel (5,5) can be pressed at a pressure of 50 kPa, and the change in capacitance are measured for all of the arrays. FIG. 8C illustrates a contour map showing the change in capacitance over the entire array. FIG. 8D contains a plot of change in capacitance versus time at various pixels away from the pixel being pressed at a pressure 50 kPa. The change in capacitance is the highest at the pixel being pressed. This demonstrates the feasibility of utilizing flexible, patterned electrodes in similar architectures such as active-matrix OLED displays and RFID tags.

Various embodiments include solution shearing techniques using controlled shearing deposition parameters to optimize properties of the deposited polymer film. The technique includes a scalable deposition technique for the fabrication of high performance polymer transparent conductors. In specific embodiments, control of the solution shearing parameters can result in PEDOT:PSS conductivity of about 4600 S/cm (e.g., 4600±100 S/cm) with a sheet resistance of about 17Ω/□ (e.g., 17±Ω/□) at about 97.2 (e.g., 97.2±0.4%) transmission. Tuning the shearing conditions allows for kinetic control over film deposition morphology, composition, and anisotropy. Solution sheared films outperform spin coated films in all aspects of FOM and applied device performance. Additionally, solution shearing allows for patterned deposition, with a demonstrated resolution of 2 m. This patterning of TCs allows use in a variety of applications including capacitive touch sensors, transistors, and organic photovoltaics.

More Specific and/or Experimental Embodiments

Figure 9A:
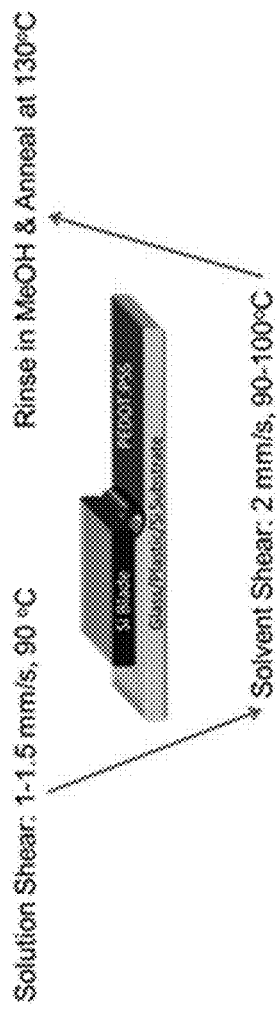
FIGS. 9A-9B show an application of a solution-sheared and solvent-sheared conductive polymeric film according to various embodiments of the present disclosure.
Figure 9B:
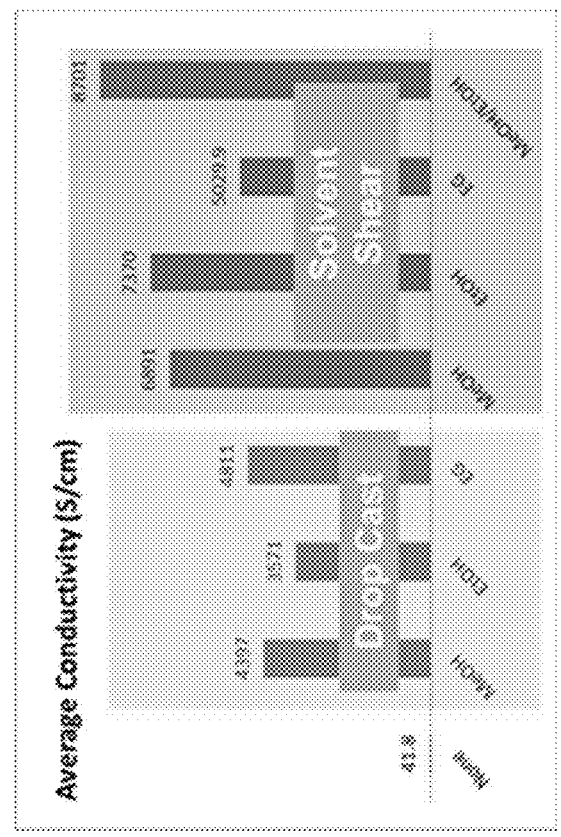

FIGS. 9A-9B show an application of a solution-sheared and solvent-sheared conductive polymeric film according to various embodiments of the present disclosure. In accordance with a number of embodiments, the techniques of solution shearing deposition and solvent processing are combined to surprisingly increase the electrical conductivity of PEDOT:PSS films as compared to the solvent being applied via drop casting.

FIG. 9A illustrates examples of various steps used to obtain consistently improved conductivities in solution sheared polymeric films. As illustrated by FIG. 9A, first solution sheared films are deposited, and then a step of solvent processing is used. Various solvents, including, but not limited to methanol, ethanol, ethylene glycol, and any combination therein, are applied to the films in the same configuration as solution shearing. Since a solvent is being used, for ease of reference this process of solvent processing is herein referred to as "solvent shearing." The solution shearing step is then followed by a rinse in methanol and subsequent annealing.

This combined process, compared to the solvent being applied via drop casting, gives higher electrical conductivity values (FIG. 9B). In accordance with various embodiments, the highest average electrical conductivity is produced using this solvent shearing methodology with a mixture of methanol and ethanol. The highest single sample value, in various specific/experimental embodiments, includes 9230 S/cm.

In various specific experimental embodiments, PEDOT:PSS films are sheared on glass, Si, Si/SiO2, and polyethylene terephthalate (PET) substrates. Substrates are rinsed with 2-propanol and exposed to a 5 min O2 plasma (1 min for PET substrates) at 150 W with 200 mTorr of O2 pressure. Films can be deposited at 65° C. and 85° C. on a temperature controlled shearing stage. The Si shearing blade can be functionalized with a highly crystalline monolayer of octadecyltrichlorosilane (OTS). For more specific and general information on functionalizing the shearing blade, reference is made to Ito Y, et al. (2009) "Crystalline ultrasmooth self-assembled monolayers of alkylsilanes for organic field-effect transistors," J Am Chem Soc, 131(26): 9396, which is incorporated herein in its entirety. The shearing blade can be orientated completely parallel to the substrate. A gap height of 100 µm can be used between the substrate and shearing blade. PEDOT:PSS is coated at speeds of 0.02-4 mm/s, producing films with a range of thickness from 20 nm to over 250 nm. Films are placed on a hotplate at 130° C. and methanol dropped on top, covering the PEDOT:PSS film. The film is annealed for 10 min, cooled to room temperature and rinsed with methanol. Once again, the substrate is annealed for 10 min at 130° C. For double layered films, methanol treatment is performed after the first deposited layer before shearing the second layer on top (and subsequent methanol treating after depositing the second layer).

Spin cast PEDOT:PSS can be performed on the same substrates as sheared films. PEDOT:PSS can be filtered with a 0.2 µm mixed cellulose acetate filter directly onto substrates and spin coated at 1000-4000 rpm for 60 seconds. Films had the same methanol treatment procedure as the above-described for sheared films.

AFM images can be recorded in tapping mode using a Veeco Multimode AFM. The resistance of films can be measured using four-point probe with collinear probes of 0.5 cm spacing, and tested using a Keithley 2400 source meter. The resistance of sheared films can be measured perpendicular to the shearing direction, unless otherwise noted. Scanning electron microscopy (SEM) can be performed with a FEI Magellan 400 XHR SEM with an acceleration voltage of 700 V. UV-vis absorption can be taken with a Cary 6000i spectrophotometer. An aperture measuring 1.3×0.4 cm is used for measurements. In specific experimental embodiments, transmission values throughout are recorded at 550 nm. Film thicknesses are measured using a contact probe Dektak 150 profilometer. All thickness values are the average of at least 3 measurements in different areas of the film. Typically depth profiling XPS uses an Ar ion sputtering gun which is destructive in organic films often losing valuable chemical information. Spin cast and sheared films on Si are analyzed with a C60 ion sputtering gun which allows for considerably gentler sputtering while often preserving chemical information in organic films. X-ray photoelectron spectroscopy (XPS) is performed with a PHI VersaProbe Scanning XPS Microprobe with a 1486 eV Al Kα photon source with 100 µm spot size (100 W, 20 kV). Sputtering is performed at 10 kV and 20 mA over a spot size of 2×2 mm. Grazing incidence wide angle X-ray spectroscopy (GI-WAXS) can be performed at Stanford Synchrotron Radiation Lightsource at beamline 11-3. Analysis and integration of diffraction data is analyzed using WxDiff.

Six 50 nm thick patterned Au electrodes can be thermally deposited on Si/SiO2 (300 nm oxide thickness) substrates with a width of 7500 µm and length of 500 µm, and PEDOT:PSS is spin coated or sheared on top. To account for contact resistance, 4-probe method is used. The conductivity is calculated for each electrode measurement according to the following calculation:

$$\sigma_{DC} = \frac{1}{R_{sheet} t},$$

where t is the film thickness. The average of at least four conductivity measurements (with different electrode spacings) is reported.

Various specific embodiments include patterning of PEDOT:PSS films and transistor fabrication. To generate small line features of PEDOT:PSS film, photolithography is used to generate strips of photoresist on a silicon substrate. The surface is then treated with O2 plasma for 30 s at 150 W to activate the SiO2 surface. The substrate can then be placed in a desiccator with a vial filled with 50 µL of tridecafluoro-1,1,2,2-tetrahydrooctyl trichlorosilane (fluorosilane) for 3 hours. Thereafter, the photoresist is removed by soaking the substrate in acetone under sonication for 1 hour. The substrate is then taken out of acetone, washed with isopropyl alcohol, and dried with nitrogen gas. To generate larger features of PEDOT:PSS film, a substrate (glass, PET, or silicon) can be first treated with O2 plasma and fluorosilane, as described above. Then a metallic shadow mask with desired features is placed on top of the substrate, and the substrate is treated briefly with O2 plasma for 10 s at 150 W. The fluorosilane is removed where there is an opening, resulting in patterned hydrophobic and hydrophilic regions.

Other specific embodiments include device fabrication. For example, position pressure sensors can be fabricated by shearing PEDOT:PSS film of PET substrates with an array of 10 hydrophilic lines in parallel. The line width and spacing can be 5 mm. Two PET substrates are then placed on top of each other with the PEDOT:PSS films facing inward, and with the electrode arrays oriented perpendicular to each other. PDMS spacers of 2 mm in diameter and 1 mm thickness are placed between every other pixel. The electrodes can be wired out using copper tape.

Organic photovoltaic devices can be fabricated on sheared PEDOT:PSS (with and without methanol treatment), spin cast PEDOT:PSS and ITO substrates. For ITO substrates, PEDOT:PSS (AI PVP 4083) is filtered with a 0.2 µm mixed cellulose acetate filter directly on the substrate and is spin cast at 3000 rpm for 1 minute. The film is then annealed at 140° C. for 10 minutes. The photoactive layer solution can be prepared from a 1:1 mass ratio of P3HT and PC61BM at a total weight concentration of 50 mg/mL in odichlorobenzene and stirred overnight at 40° C. The photoactive blend solution is spin cast in air on top of the appropriate TC substrate at 600 rpm for 1 min and placed in a covered Petri dish to dry for 20 minutes in air. Substrates are then loaded into a thermal evaporator and top contacts are deposited at a pressure<1×10-5 torr. 0.4 nm of LiF at 0.1 Å/s, and 50 nm of Al at 1-4 Å/s were deposited defining an area of 0.04 cm2. Devices are removed from the evaporator, exposing the devices to air, and tested under AM1.5G simulated solar conditions in a glove box. The Newport solar simulator can have a photon flux of 100 mW/cm2 and can be calibrated using a certified KG-5 filtered silicon reference cell. Source voltage and measured current can be performed using a Keithley 2400 source meter.

Terms to exemplify orientation, such as upper/lower, left/right, top/bottom, above/below, and perpendicular, may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

Various embodiments are implemented in accordance with the underlying Provisional Application (Ser. No. 62/247,006), entitled "Methods and Apparatus Concerning Tunably Solution Shearing a Conductive Polymer Film" filed on Oct. 27, 2015 and with an Appendix, to which benefit is claimed and which are fully incorporated herein by reference. For instance, embodiments herein and/or in the provisional application (including the appendices therein) may be combined in varying degrees (including wholly). Reference may also be made to the experimental teachings and underlying references provided in the underlying provisional application, including the Appendix that form part of the provisional application. Embodiments discussed in the Appendix are not intended, in any way, to be limiting to the overall technical disclosure, or to any part of the claimed invention unless specifically noted.

The Appendix of the underlying Provisional Application is hereby fully incorporated by reference for its general and specific teachings, including the figure showing a polymeric films described in an article "Ultrahigh Electrical Conductivity in Solution Sheared Polymeric Transparent films," pp. 1-6, along with its references. It is recognized that polymeric film structures and methods of manufacture (including those discussed in the context of pp. 1-6 can be used in this and other contexts. This document is fully incorporated herein by reference for its teachings (including background references cited therein and which disclose applications beneficial to aspects of the present disclosure), generally and specifically, to the structures, processes, methods and uses described and shown therein. Embodiments discussed in the Appendix are not intended, in any way, to be limiting to the overall technical disclosure, or to any part of the claimed invention unless specifically noted. This Appendix document (and specific exemplary portions thereof) describes and shows example preparations and uses of conductive polymer films.

Those skilled in the art would appreciate the above-provided contexts of certain aspects of the disclosure, particularly in light of the following: "PEDOT:PSS" (or poly (3,4-ethylenedioxythiophene) polystyrene sulfonate) refers to a polymer mixture of two ionomers, the mixture having one component which is composed of or includes sodium polystyrene sulfonate (a sulfonated polystyrene) and another component composed of poly(3,4-ethylenedioxythiophene) (PEDOT).

Based upon the above discussion and illustrations, those skilled in the art would readily recognize that various modifications and changes may be made to the various embodiments without strictly following the exemplary embodiments and applications illustrated and described herein. Such modifications do not depart from the true spirit and scope of various aspects of the invention, including aspects set forth in the provisional claims.

What is claimed is:

1. A method comprising:
providing a shearing blade on a portion of a substrate coated with a polymeric conductor material; and
controlling generation of a transparent and conductive polymer film on the substrate by moving the shearing blade in a direction, to generate shear stress to the polymeric conductor material, and according to shearing deposition parameters.

2. The method of claim 1, wherein controlling the generation of the transparent and conductive polymer film includes tunably controlling the generation using the shearing deposition parameters to optimize a property of the transparent and conductive polymer film, wherein the optimized property includes a property selected from the group consisting of: phase separation, polymer backbone alignment, electrical conductivity, kinetic control, optical transparency of the transparent and conductive polymer film, and a combination thereof.

3. The method of claim 1, wherein controlling the generation of the transparent and conductive polymer film includes tunably controlling the generation using the shearing deposition parameters that includes selectively patterning solvent wetting and de-wetting regions on the substrate.

4. The method of claim 1, wherein the polymeric conductor material is a polymer mixture of two ionomers and wherein controlling the generation of the transparent and conductive polymer film includes tunably controlling the generation using the shearing deposition parameters to control a back orientation, local ordering, and/or phase separation of the transparent and conductive polymer film formed from the polymeric conductor material.

5. The method of claim 1, further including adjusting the shearing deposition parameters to optimize a property of the transparent and conductive polymer film, wherein the shearing deposition parameters that are adjusted include a parameter selected from the group consisting of: shearing speed, thickness of a coating of the polymeric conductor material, a temperature of the substrate, and a combination thereof.

6. The method of claim 1, further including rinsing the transparent and conductive polymer film with a chemical mixture to optimize a property of the transparent and conductive polymer film.

7. The method of claim 6, wherein rinsing with the chemical mixture includes using a methanol and ethanol mixture, and without application of heat.

8. The method of claim 1, wherein providing the shearing blade includes providing a shearing blade having patterned pillars.

9. The method of claim 1, wherein the polymeric conductor material is poly(3,4-ethylenedioxythiophene):poly (styrenesulfonate) (PEDOT:PSS).

10. The method of claim 1, wherein controlling generation of the transparent and conductive polymer film includes generating the transparent and conductive polymer film having a sheet resistance of less than $100\Omega/\square$ and a transmissivity of at least 0.90.

11. The method of claim 1, wherein controlling generation of the transparent and conductive polymer film includes generating the transparent and conductive polymer film having a conductivity of between 1 S/cm and 9230 S/cm with resistance between 16.9 and $100\Omega/\square$ at transmissivity of between 0.9 and 0.976.

12. A method comprising:
coating a portion of a substrate with a polymeric conductor material;

providing a shearing blade on the portion of the substrate coated with the polymeric conductor material; and tunably controlling generation of a transparent and conductive polymer film on the substrate to optimize a property of the transparent and conductive polymer film by moving the shearing blade in a direction, to generate shear stress to the polymeric conductor material, and according to shearing deposition parameters.

13. The method of claim 12, further including rinsing the transparent and conductive polymer film using a methanol and ethanol mixture to optimize conductivity of the generated transparent and conductive polymer film.

14. The method of claim 12, further including adjusting a shearing speed used to move the shearing blade in the direction to optimize at least one of a resistance, a conductivity, a transmissivity, and a degree of alignment of the generated transparent and conductive polymer film, and wherein tunably controlling generation of the transparent and conductive polymer film includes generating the transparent and conductive polymer film having a sheet resistance of less than 100Ω/□.

15. The method of claim 12, further including adjusting a temperature of the substrate while generating the transparent and conductive polymer film to optimize at least one of a resistance and a transmissivity of the generated transparent and conductive polymer film of at least 0.90.

16. The method of claim 12, further including rinsing the transparent and conductive polymer film with a chemical to optimize phase separation of the generated transparent and conductive polymer film.

17. The method of claim 12, further including patterning a transparent electrode using the transparent and conductive polymer film, wherein the polymeric conductor material is a polymer mixture of two ionomers.

18. An apparatus, comprising:
a substrate; and
a transparent and conductive polymer film, configured and arranged on the substrate, having an optimized property and formed according to shearing deposition parameters of a solution-shearing process used to deposit the transparent and conductive polymer film on the substrate, wherein the transparent and conductive polymer film includes a polymer mixture of two ionomers.

19. The apparatus of claim 18, wherein the transparent and conductive polymer film includes patterns of transparent and conductive polymer film in lateral patterns between de-wetting regions on the substrate.

20. The apparatus of claim 18, wherein the apparatus is a transparent electrode for use in an electronic device selected from the group consisting of an optoelectronic device, a capacitive touch sensor, and an energy conversion device.

21. The apparatus of claim 18, wherein the transparent and conductive polymer film exhibits a conductivity of between 1 S/cm and 9230 S/cm with resistance between 16.9 and 100Ω/□ at transmissivity of between 0.9 and 0.976.

22. The apparatus of claim 18, wherein the transparent and conductive polymer film includes defined fibers that form an interconnected mesh network.

23. An apparatus, comprising:
a substrate; and
a transparent and conductive polymer film, configured and arranged on the substrate, having an optimized property and formed according to shearing deposition parameters of a solution-shearing process used to deposit the transparent and conductive polymer film on the substrate, wherein the transparent and conductive polymer film includes poly(3,4-ethylenedioxythiophene):poly(styrenesulfonate) (PEDOT:PSS) exhibiting a phase separation between PSS and PEDOT, wherein the PEDOT is located proximal to the substrate.

24. A method comprising:
providing a shearing blade on a portion of a substrate coated with a polymeric conductor material including poly(3,4-ethylenedioxythiophene):poly(styrenesulfonate) (PEDOT:PSS); and
controlling generation of a transparent and conductive polymer film on the substrate by moving the shearing blade in a direction, to generate shear stress to the polymeric conductor material, and according to shearing deposition parameters.

* * * * *